United States Patent [19]
Dougherty

[11] Patent Number: 5,773,977
[45] Date of Patent: Jun. 30, 1998

[54] METHOD OF TESTING AN ELECTRIC STORAGE BATTERY BY DETERMINING A BOUNCE-BACK VOLTAGE AFTER A LOAD HAS BEEN REMOVED

[75] Inventor: Thomas J. Dougherty, Waukesha, Wis.

[73] Assignee: Johnson Controls Technology Company, Plymouth, Mich.

[21] Appl. No.: 634,650

[22] Filed: Apr. 18, 1996

[51] Int. Cl.$^6$ .............................................. G01N 27/416
[52] U.S. Cl. .......................................... 324/429; 324/427
[58] Field of Search .................................. 324/426, 427, 324/429, 430, 433, 434; 364/483; 320/48; 340/636

[56] References Cited

U.S. PATENT DOCUMENTS 4,193,025 3/1980 Frailing .................................. 324/427
4,322,685 3/1982 Frailing et al. .

*Primary Examiner*—Christine K. Oda
*Attorney, Agent, or Firm*—Quarles & Brady

[57] ABSTRACT

A battery tester and associated method for determining if one or more cells in a storage battery are capable of storing sufficient charge prior to charging the battery. A predetermined load is applied to the battery for a predetermined period of time, and then the bounce back voltage of the battery is measured immediately after the load is removed. If the bounce back voltage of the battery is within a predetermined range after a predetermined time after the load is removed, then one or more cell in the battery is bad and the battery can be rejected prior to being charged.

26 Claims, 2 Drawing Sheets

METHOD OF TESTING AN ELECTRIC STORAGE BATTERY BY DETERMINING A BOUNCE-BACK VOLTAGE AFTER A LOAD HAS BEEN REMOVED

BACKGROUND OF THE INVENTION

1. Field of the Invention

This invention relates generally to a method of testing an electric storage battery and, more particularly, to a method of determining if one or more cells of an electric storage battery are bad by first applying a load to the battery, and then measuring the bounce back voltage of the battery.

2. Discussion of the Related Art

As is well understood in the art, a vehicle includes an electric storage battery that provides the power necessary to start the vehicle and to operate the various vehicle systems. The vehicle also includes an alternator that charges the battery when the vehicle is running so that the battery maintains a sufficient charge for these purposes. A typical vehicle battery will be a 12 volt lead-acid battery including six independent cells electrically connected together. Other sized batteries may also be used for this purpose, such as 6 volt batteries having three independent cells and 24 volt batteries having twelve independent cells. Each cell in a battery of this type includes a positive and negative terminal where the cells are electrically connected together in a series configuration.

Due to various reasons, such as a power drain on the battery when the vehicle is not running, the capacity of a vehicle battery may become diminished, and the battery will not be able to provide the power necessary to start the vehicle and/or operate the various vehicle systems. It is therefore necessary to use a separate charging device to recharge the battery and return it to its full or near full capacity for subsequent use in the vehicle. It has heretofore been known to be desirable to test the battery prior to recharging it to ensure that one or more cells in the battery are not defective, making recharging of the battery useless and unwise. Charging a battery having one or more cells may provide certain health and safety risks in that the bad cell may emit harmful smoke and/or gases during the charging sequence.

Sometimes, the capacity of the battery has been reduced to such an extent, in a typical case below 50% capacity, that the battery must be recharged prior to determining if the battery is capable of storing sufficient charge. For the most part, however, the capacity of a diminished battery is above this capacity where a test can first be performed on the battery to determine if it is applicable to be charged and reused.

One known tester used in conjunction with a battery charger for charging a 12 volt vehicle battery measures the open circuit voltage of the battery prior to charging. If the open circuit battery voltage is significantly less than the rated full voltage of the battery, for example 10 volts for a 12 volt battery, then it is determined that one or more of the cells in the battery is not storing and providing power. Therefore, the test would determine that one of the cells is bad and the battery should not be charged.

A problem exists in the above described prior art technique for determining bad cells in a storage battery. Because a battery that has been removed from a vehicle may have been recently charged by the vehicle, a bad cell in the battery may retain a surface charge that would indicate that the cell is providing power during the test. In other words, even though the cell may not be functioning properly to provide power under a load condition, a charged bad cell may have a surface charge that would indicate that the cell is operating at full power under open circuit conditions.

What is needed is a battery tester that allows a battery to be tested to determine if one or more of the cells in the battery is bad prior to the battery being charged. It is therefore an object of the present invention to provide such a technique.

SUMMARY OF THE INVENTION

In accordance with the teachings of the present invention, a battery tester and associated method is disclosed for determining if one or more cells in an electric storage battery are capable of adequately storing charge prior to recharging the battery. The technique includes applying a predetermined load to the battery for a predetermined period of time, and then determining the bounce back voltage (open circuit voltage) of the battery immediately after the load is removed. Applying the load removes any surface charge that may be present on a non-functioning cell. If the bounce back voltage of the battery falls within a predetermined range of voltages after a predetermined time after the load is removed, then it can be determined that one or more of the cells are bad and the battery can be rejected.

In one embodiment, the open circuit voltage of the battery is measured prior to applying the load to determine if the battery is below a certain diminished capacity that measuring the bounce back voltage will not be effective after the load is applied for the test. If it is determined that the battery has such a diminished capacity, a charge is applied to the battery for a limited predetermined period of time prior to applying the load to determine if one or more of the cells are bad.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to a battery tester and method for determining bad cells in an electric storage battery is merely exemplary in nature and is in no way intended to limit the invention or its applications or uses.

Figure 1:
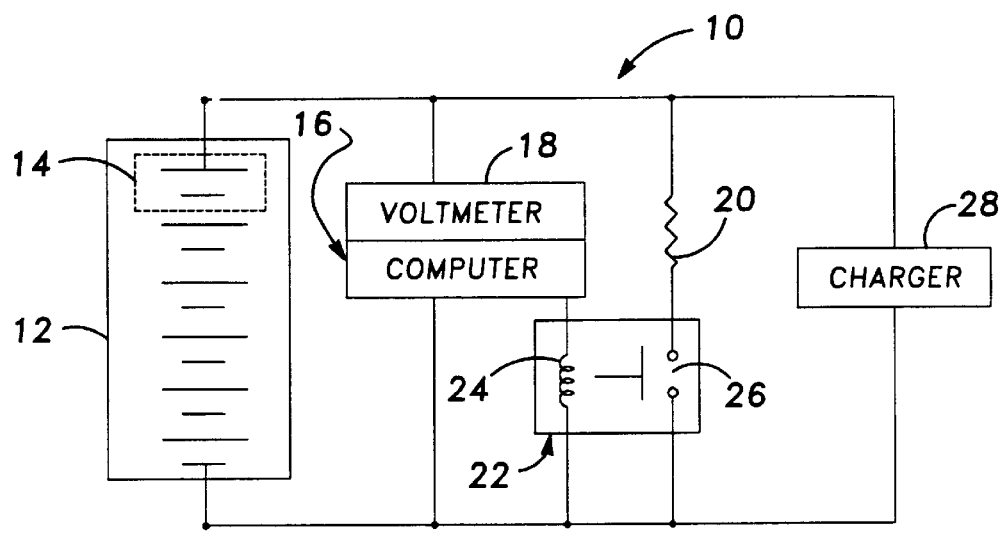
FIG. 1 is a block schematic diagram of a battery tester according to an embodiment of the present invention.

FIG. 1 shows a block schematic diagram of a battery tester 10 according to an embodiment of the present invention. A battery 12, such as a vehicle battery, is electrically connected to the battery tester 10, as shown. In this embodiment, the battery 12 is a 12 volt battery that includes six independent battery cells 14 connected in series where each cell 14 provides about 2 volts. However, as will be appreciated by those skilled in the art, the battery 12 can have any suitable voltage and include any suitable number of battery cells and still be within the scope of the present invention.

A computer 16 is electrically connected to the tester 10 to provide the necessary control. Of course other suitable control devices besides a computer can be used to control the operation of the tester 10. The computer 16 includes a voltmeter 18 that is connected in parallel across the battery 12, and is applicable to provide a reading of the overall voltage of the battery 12. A load 20, here a resistor, is also connected in parallel across the battery 12. A relay 22, including a relay coil 24 and a switch 26, is electrically connected to the load 20 and the battery 12. An appropriate signal from the computer 16 applied to the coil 24 causes the switch 26 to close, and thus the load 20 to be electrically connected to the battery 12 in parallel. Of course, the relay 22 can be replaced with a simple switch that can be manually closed to electrically connect the load 20 to the battery 12. The tester 10 may optionally include a charging device 28 connected in parallel to the battery 12, and applicable to charge the battery 12 in the event that the results of the test are satisfactory. Suitable charging devices for this purpose would be well known to those skilled in the art.

The computer 16 causes the relay 22 to apply the load 20 across the battery 12 for a predetermined period of time prior to taking a voltage reading of the battery 12 by the voltmeter 18. In one embodiment, the load 20 is a 0.1 ohm resistor that results in a current draw form the battery 12 of approximately 100 amps when the switch 26 is closed. For this load, the relay 22 is closed for approximately 10–15 seconds to provide the adequate time satisfactory for the test of the invention. Of course, the value of the load 20 and the time the relay 22 is closed can include many other combinations within the scope of the present invention. For example, the load 20 can be of a value that results in a current draw from the battery 12 within the range of about 2 amps to about 2000 amps, and the relay 22 can be closed for a time within the range of about 1/10 of a second to about twenty minutes.

By applying the load 20 across the battery 12, any surface charge that may be present on a bad cell in the battery 12 is drained off by the load 20. Therefore, if one or more of the cells 14 are bad and incapable of storing and providing power, it will be possible to determine this by the bounce back or open circuit voltage of the battery 12 measured by the voltmeter 18 after the load 20 is removed.

Figure 2:
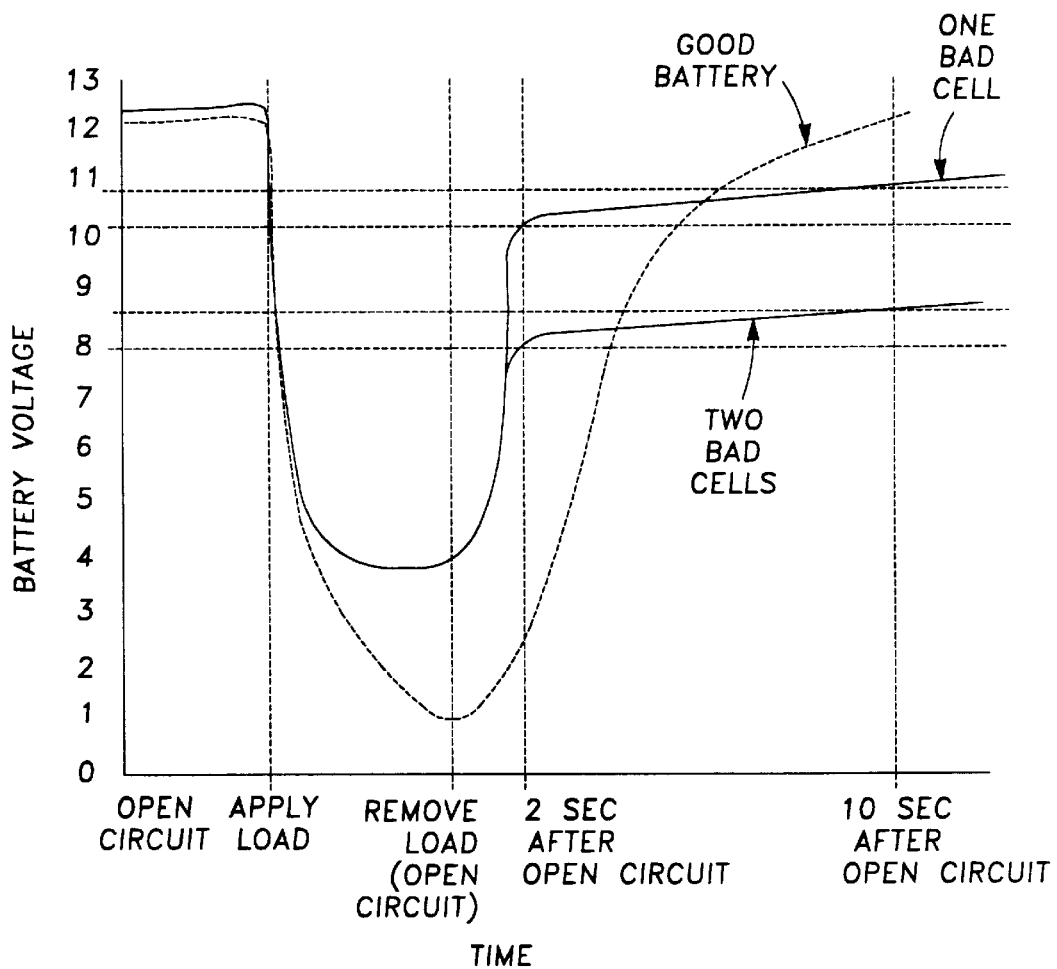
FIG. 2 is a graph showing battery voltage on the vertical axis and time on the horizontal axis to show bounce back voltage over time of a battery being tested.

FIG. 2 shows a graph of battery voltage on the vertical axis and time on the horizontal axis that illustrates how it is possible to determine if one or more of the cells 14 are not providing and storing power, according to the invention. As illustrated in the open circuit portion at the left side of the graph, a 12 volt vehicle battery having six cells will have an open circuit voltage of approximately 12.3 volts, if the battery has a capacity above a certain minimum capacity. If the battery has a diminished capacity, and the load 20 is applied across the battery 12, then the battery voltage will significantly decrease, as illustrated. The load 20 will cause the battery voltage to decrease significantly more if the battery 12 does not have a bad cell.

After a predetermined period of time has elapsed, the load 20 is removed by opening the switch 26. The bounce back or open circuit voltage of the battery 12 will then increase. If the battery is operating properly, i.e., no cells are bad, the bounce back voltage will eventually return to the 12.3 volts, in this example after more than 10 seconds, as indicated by the good battery graph line. If one of the cells 14 is bad, and is unable to store power, the battery voltage will be approximately 10.1 volts about 2 seconds after the load 20 is removed, and will be approximately 10.7 volts about 10 seconds after the load 20 is removed, as indicated by the one bad cell graph line. Likewise, if two of the cells 14 are bad, the battery voltage will be approximately 8.05 volts about two seconds after the load 20 is removed, and will be about 8.6 volts about ten seconds after the load 20 is removed, as indicated by the two bad cells graph line. Similar characteristics can be observed if more than two of the cells are bad.

As indicated in FIG. 2, the slope of the graph lines for the bad cells is much steeper than the slope of the graph line for the good battery after the load is removed. Therefore, in an alternate embodiment, instead of providing a measurement of the actual bounce back voltage of the battery after the load is removed to determine if the cells are bad, it is also possible to measure the slope of the graph line of battery voltage with respect to time to determine if one or more cells in the battery are bad.

In a limited number of cases, a battery that needs to be charged has such a diminished capacity, for example, below 50% battery capacity, that the battery must first be charged for a certain limited amount of time prior to being tested in the manner as described above. The limited amount of charge is not enough to cause problems, such as smoking and degassing, that would occur if one or more cells of the battery were bad.

Figure 3:
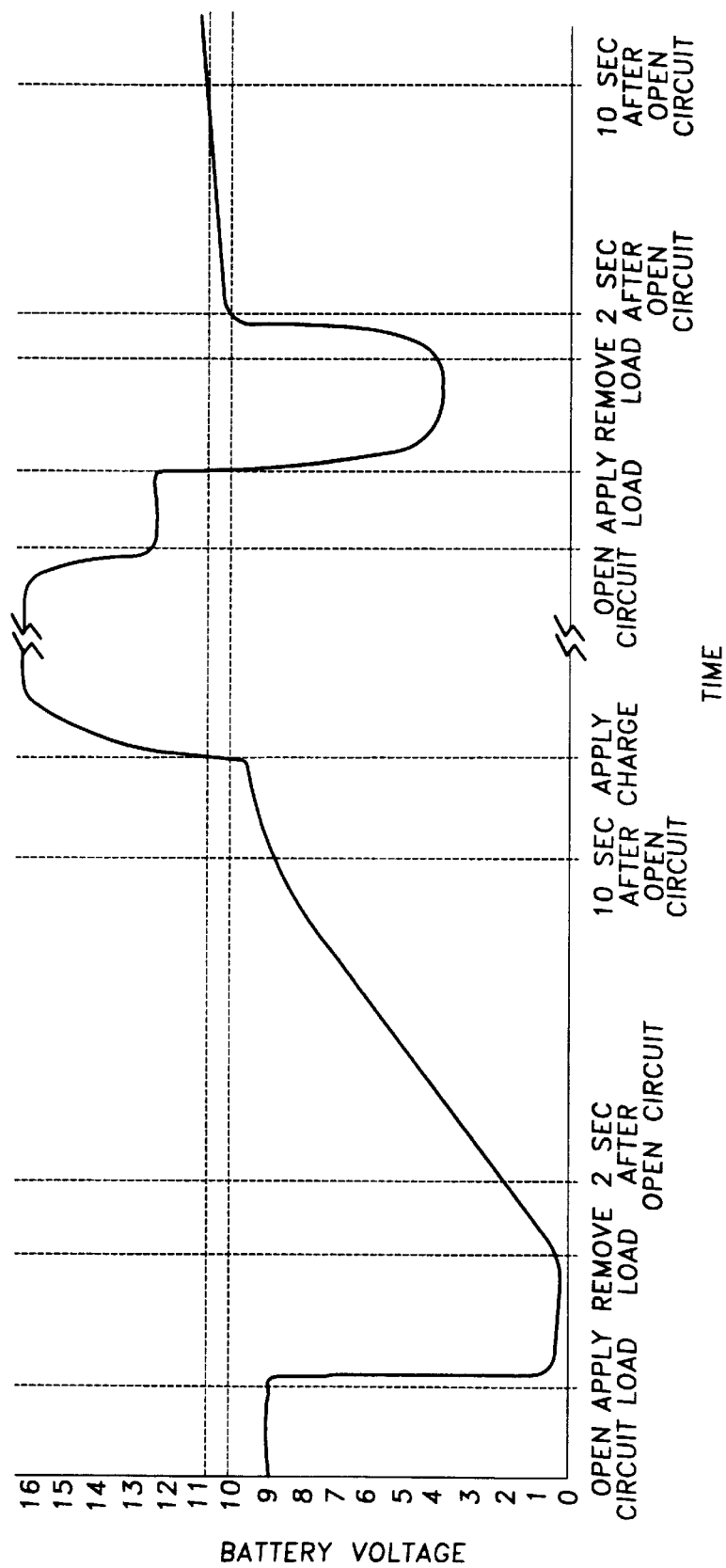
FIG. 3 is a graph showing battery voltage on the vertical axis and time on the horizontal axis to show battery voltage characteristics under open circuit, load, and charging conditions.

FIG. 3 shows a graph of battery voltage on the vertical axis and time on the horizontal axis that illustrates a charging and testing sequence when a battery first needs to be charged prior to being tested. In this example, an initial open circuit voltage of about 9.5 volts indicates that the capacity of the battery 12 is below an open circuit value where the above-described test is not appropriate. Of course, the battery can have other open circuit voltages. Applying the load 22 to the battery 12 when it is in this condition drops the battery voltage to nearly zero, as shown. Removing the load 22 causes the open circuit voltage to return to the 9.5 volts open circuit value after approximately ten seconds. Such a characteristic indicates that the battery 12 must first be charged prior to performing the test to determine if one or more of the cells 14 are bad.

Therefore, prior to testing the battery for a bad cell as discussed above, a charge is placed on the battery for a predetermined period of time, for example five minutes. As will be appreciated by those skilled in the art, other charging times may be applicable depending on the amount of the charging current, such as between about ten seconds and about twenty minutes. The charging will raise the open circuit voltage of the battery 12 to the value of about 12.3 volts.

Once the charge of the battery 12 has reached the desired value, then the test for determining if one or more cells 14 are bad can be performed as discussed above, and indicated by the second half of the graph shown in FIG. 3. This portion of the graph shows the characteristic for one bad cell 14. It may be necessary to apply the charge more than once to bring the open circuit voltage to the desired level before the test.

The above described relationship shown in FIGS. 2 and 3 are for a 12 volt battery. Of course, if the battery has a different number of cells, then the proportional amount that the bounce back voltage will be below the full voltage of the battery after the load 20 is removed will depend on that number of cells. For example, if one cell of twelve cells of a 24 volt battery is bad, then the bounce back voltage will be approximately one twelfth of the total battery voltage of 24 volts. Also, the battery tester 10 has been described as charging a vehicle battery. However, the invention is applicable to test any battery that includes a plurality of cells connected in series, including, but not limited to lithium batteries, nickel cadmium (NICAD) batteries, and metal hydride batteries.

The foregoing discussion discloses and describes merely exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A method of testing a battery to determine if one or more individual cells of the battery are bad by connecting the battery to a control circuit including a predetermined load and a switching means for controlling the connection of said load to the battery, said method comprising the steps of:

connecting said predetermined load to the battery for a first predetermined period of time;

disconnecting said predetermined load from the battery after said first predetermined period of time;

monitoring the voltage of the battery after said load has been removed; and determining if one or more cells of the battery are bad based on said monitored battery voltage, wherein the step of determining if one or more cells of the battery are bad includes determining the battery voltage level a second predetermined period of time after the predetermined load is disconnected from the battery and comparing the determined battery voltage level to a predetermined battery voltage level so that if the determined battery voltage level is below the predetermined battery voltage level, then at least one of the cells is bad.

2. The method according to claim 1 wherein the step of connecting said predetermined load results in a current draw from the battery of between approximately 2 amps and approximately 2000 amps.

3. The method according to claim 1 wherein said first predetermined period of time is within the range of approximately 10 seconds to approximately 15 seconds.

4. The method according to claim 1 wherein the battery is a 12-volt battery and the step of determining if one or more cells are bad includes the steps of determining that one cell is bad if the voltage of the battery is about 10.1 volts about two seconds after the load is removed and is about 10.7 volts about ten seconds after the load is removed.

5. The method according to claim 1 wherein the battery is a 12-volt battery and the step of determining if one or more cells are bad includes the steps of determining that two of the cells are bad if the voltage of the battery is about 8.05 volts about two seconds after the load is removed and is about 8.6 volts about ten seconds after the load is removed.

6. The method according to claim 1 wherein the battery is a 12-volt leadacid battery including six cells.

7. The method according to claim 1 wherein the step of connecting a predetermined load to the battery includes connecting a resistor in parallel with the battery.

8. The method according to claim 1 further comprising the step of charging the battery if the step of determining if one or more cells are bad determines that no cells are bad.

9. The method according to claim 1 wherein the step of determining if one or more cells of the battery are bad includes the step of determining a slope of battery voltage with respect to time after the load is disconnected.

10. The method according to claim 1 further comprising the preliminary steps of measuring the battery voltage and charging the battery for a third predetermined period of time prior to the step of connecting a predetermined load to the battery if the measured battery voltage is below a predetermined value.

11. The method according to claim 10 wherein the step of charging the battery includes the step of charging the battery for about a five-minute time period.

12. A system for testing a battery to determine if one or more individual battery cells of the battery are bad, said system comprising:

a predetermined load; and a control circuit including monitoring means for monitoring the voltage of the battery and switch means for controlling the connection of the load to the battery, said switch means electrically connecting the load to the battery for a first predetermined period of time and then disconnecting the load from the battery, and said monitoring means monitoring the voltage of the battery after the load is disconnected to determine if the one or more cells are bad, said monitoring means determining that the one or more cells are bad if the battery voltage is below a predetermined battery voltage a second predetermined period of time after the predetermined load is disconnected by comparing the monitored battery voltage at the second predetermined period of time to the predetermined battery voltage.

13. The system according to claim 12 wherein the predetermined load results in a current draw from the battery of between approximately 2 amps and approximately 2000 amps.

14. The system according to claim 12 wherein said first predetermined period of time is within the range of approximately 10 seconds to approximately 15 seconds.

15. The system according to claim 14 wherein the battery is a 12-volt battery and one cell is bad if the voltage of the battery is about 10.1 volts about two seconds after the load is disconnected and is about 10.7 volts about ten seconds after the load is disconnected.

16. The system according to claim 14 wherein the battery is a 12-volt battery and two of the cells are bad if the voltage of the battery is about 8.05 volts about two seconds after the load is disconnected and is about 8.6 volts about ten seconds after the load is disconnected.

17. The system according to claim 12 wherein the battery is a 12-volt leadacid battery including six cells.

18. The system according to claim 12 wherein the load is a resistor.

19. The system according to claim 12 wherein said control circuit further comprises a charging device, said charging device charging the battery if the system determines that no cells are bad.

20. A system according to claim 19 wherein the charging device charges the battery prior to the switching means electrically connecting the load to the battery if the battery voltage is below a predetermined level.

21. A method of testing a battery to determine if one or more individual battery cells of the battery are bad by connecting the battery to a control circuit including a switching circuit for controlling the connection of a predetermined load to the battery and a charging circuit for charging the battery, said method comprising the steps of:

providing a battery to be tested, said battery including a plurality of battery cells electrically connected together in a series configuration;

determining whether the voltage of the battery is above a predetermined level;

charging the battery for a first predetermined period of time if the voltage of the battery is below said predetermined level;

connecting said predetermined load to the battery, said load resulting in a current draw from the battery of between approximately 2 amps and approximately 2000 amps;

disconnecting the load from the battery a second predetermined period of time after the load is connected to the battery;

monitoring the voltage of the battery after the load has been disconnected;

determining if one or more of the plurality of battery cells of the battery are bad based on the monitored battery voltage, said step of determining if one or more of the plurality of battery cells are bad includes determining the battery voltage level a third predetermined time after the load is disconnected from the battery and comparing the determined battery voltage level to a predetermined battery voltage level so that if the determined battery voltage level is below the predetermined battery voltage level, then at least one of the cells is bad; and charging the battery if it is determined that no cells are bad.

22. The method according to claim 21 wherein said first predetermined period of time comprises approximately five minutes.

23. The method according to claim 21 wherein the battery is a 12-volt leadacid battery including 6 cells.

24. The method according to claim 23 wherein the battery is a 12-volt battery and the step of determining if the one or more cells are bad includes the steps of determining that one cell is bad if the battery voltage is about 10.1 volts about 2 seconds after the load is disconnected and is about 10.7 volts about 10 seconds after the load is disconnected.

25. The method according to claim 21 wherein the step of determining if one or more cells of the battery are bad includes the step of determining a slope of battery voltage with respect to time after the load is disconnected.

26. A method of testing a battery to determine if one or more individual cells of the battery are bad by connecting the battery to a control circuit including a predetermined load and a switching means for controlling the connection of said load to the battery, said method comprising the steps of:

connecting said predetermined load to the battery for a first predetermined period of time;

disconnecting said predetermined load from the battery after said first predetermined period of time;

monitoring the voltage of the battery after said load has been removed; and determining if one or more cells of the battery are bad based on said monitored battery voltage, wherein the step of determining if one or more cells of the battery are bad includes the step of determining a slope of the battery voltage with respect to time after the load is disconnected.

* * * * *